(12) United States Patent
Boecker et al.

(10) Patent No.: US 7,167,410 B2
(45) Date of Patent: Jan. 23, 2007

(54) MEMORY SYSTEM AND MEMORY DEVICE HAVING A SERIAL INTERFACE

(75) Inventors: Charles Boecker, Ames, IA (US); Scott Irwin, Ames, IA (US); Matthew Shafer, Ankeny, IA (US); Eric Groen, Ankeny, IA (US); Aaron Hoelscher, Ankeny, IA (US); Andrew Jenkins, Nevada, IA (US); David Black, Story City, IA (US)

(73) Assignee: Magnalynx, Ames, IA (US)

( * ) Notice: Subject to any disclaimer, the term of this patent is extended or adjusted under 35 U.S.C. 154(b) by 0 days.

(21) Appl. No.: 11/114,807

(22) Filed: Apr. 26, 2005

(65) Prior Publication Data

US 2006/0239107 A1    Oct. 26, 2006

(51) Int. Cl.
*G11C 8/00* (2006.01)
(52) U.S. Cl. .................. 365/230.06; 365/233; 365/221; 326/41; 331/53
(58) Field of Classification Search ........... 365/230.06, 365/233, 221; 326/41; 331/53
See application file for complete search history.

(56) References Cited

U.S. PATENT DOCUMENTS

| | | | |
|---|---|---|---|
| 6,650,140 B1 | 11/2003 | Lee et al. | |
| 6,693,985 B1 | 2/2004 | Li et al. | |
| 6,731,683 B1 | 5/2004 | Fiedler et al. | |
| 6,738,917 B1 | 5/2004 | Hummel et al. | |
| 6,738,942 B1 | 5/2004 | Sridharan et al. | |
| 6,750,675 B1 | 6/2004 | Venkata et al. | |
| 6,754,238 B1 | 6/2004 | Lentine et al. | |
| 6,757,327 B1 | 6/2004 | Fiedler | |
| 6,777,979 B1 | 8/2004 | Zhu et al. | |
| 6,831,523 B1* | 12/2004 | Pastorello et al. | 331/25 |
| 6,987,424 B1* | 1/2006 | Hein | 331/53 |
| 2004/0076119 A1* | 4/2004 | Aronson et al. | 370/249 |
| 2005/0135470 A1* | 6/2005 | Momtaz | 375/233 |
| 2005/0179782 A1* | 8/2005 | Endo | 348/207.99 |
| 2005/0286507 A1* | 12/2005 | Sterling et al. | 370/363 |
| 2006/0047899 A1* | 3/2006 | Iida et al. | 711/113 |

OTHER PUBLICATIONS

Chiarulli et al. "Making Virtual Memory Real: Integrating an Optical Memory Into the Memory Hierarchy" http://ipdps.cc.gatech.edu/1997/wocs/chiarull.pdf.*

* cited by examiner

*Primary Examiner*—Anh Phung
*Assistant Examiner*—Eric J. Wendler
(74) *Attorney, Agent, or Firm*—Toler Schaffer, LLP

(57) ABSTRACT

A memory device and system are disclosed that may include a serial data interface, a serial address interface, and a reference clock interface. The reference clock interface is configured to receive a signal from a reference clock source that provides a reference clock signal to a memory control device. The serial interfaces are coupled to other memory devices or memory control devices. A method of transferring data within a memory system using serial interfaces is also disclosed. The method includes performing clock multiplication on a reference clock to provide a multiplied clock, using the multiplied clock to serialize and transmit data onto a serial interface, recovering data from the seal interface, using the reference clock to determine an initial frequency for use by clock and data recovery module, using the data recovered from the serial interface to determine a phase and final frequency of a recovered clock, and using the recovered clock to de-serialize received serial data into parallel data words.

20 Claims, 3 Drawing Sheets

MEMORY SYSTEM AND MEMORY DEVICE HAVING A SERIAL INTERFACE

FIELD OF THE DISCLOSURE

The disclosure is generally related to memory systems and memory devices having a serial interface.

BACKGROUND

As computer processor speeds and data network communication speeds increase, there is a desire for computer memory speeds to also increase. One limitation on memory performance is the amount of available bandwidth for storing and retrieving data with respect to a memory device. The available bandwidth of memory devices is determined at least in part by the interface to the memory device. One type of common interface to a memory is a parallel interface. Parallel interfaces often experience transmission problems at higher frequencies.

Accordingly, there is a need for an improved memory system and an interface for high performance computer memory devices.

DETAILED DESCRIPTION OF THE DRAWINGS

The present disclosure is generally directed to a memory system, a memory device, and a method of transferring data over a serial interface of a memory device. In a particular embodiment, the memory device includes a plurality of serial interfaces, and a reference clock interface. The reference clock interface is configured to receive a signal from a reference clock source that provides a reference clock signal to a memory control device. The serial interfaces are coupled to other memory devices or memory control devices.

Figure 1:
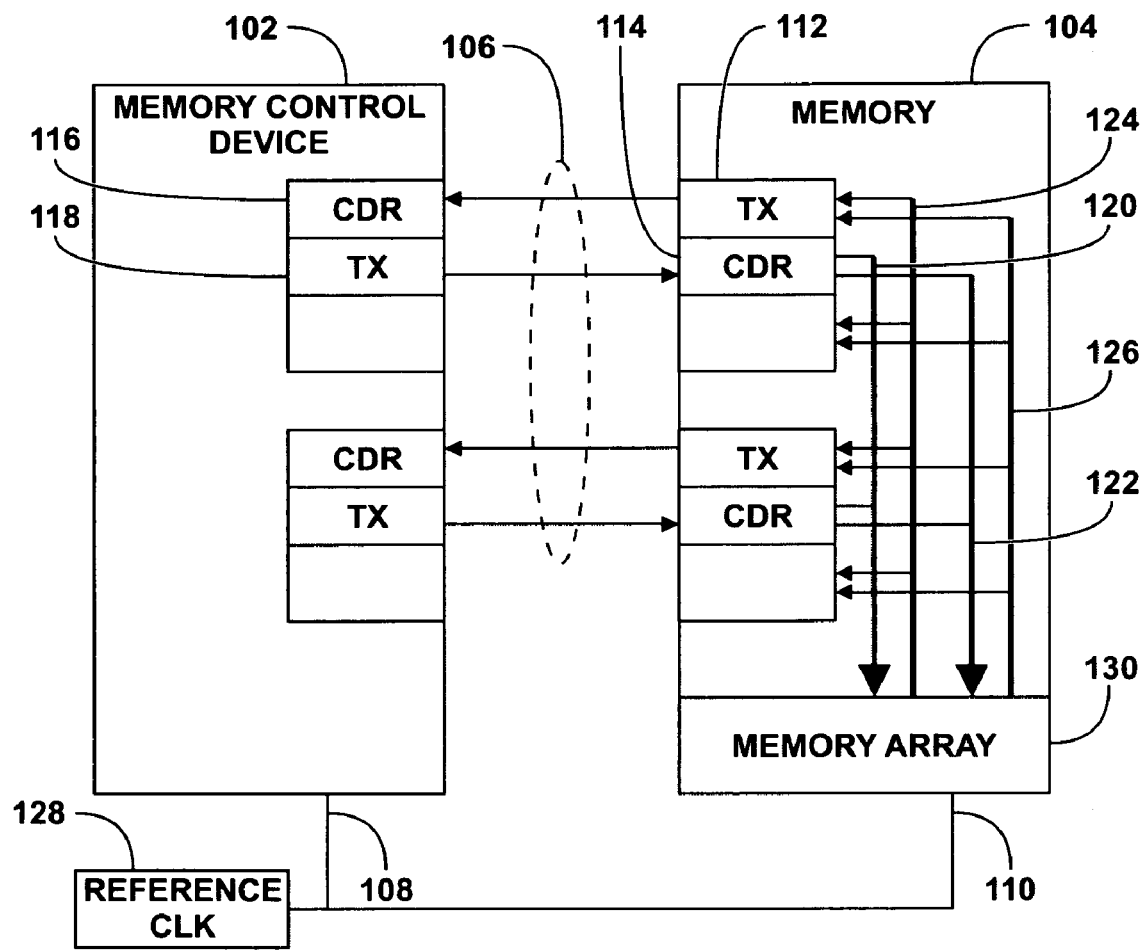
FIG. 1 is a block diagram of a memory control device, a memory, and an interface between the memory control device and the memory.

Referring to FIG. 1, a system is shown that includes a memory control device 102, a memory device 104, and a reference clock 128. The reference clock 128 provides a first clock signal 108 to the memory control device 102 and a second clock signal 110 to the memory 104. As an alternative, the second clock signal 110 to the memory 104 may come from the memory control device 102. The memory control device 102 is coupled to the memory device 104 by one or more serial interface(s) 106. The serial interfaces provide data, address, and control information, which enable the operation of the memory. Each serial interface is one of two types: uni-directional to the memory or uni-directional from the memory. The uni-directional to the memory interface communicates data that originates outside the memory through the use of a transmitter and the data is terminated inside the memory through the use of a clock and data recovery circuit. The uni-directional from the memory takes data from the memory array and sends it out on a serial interface. The data is recovered from the serial interface at the other end by a clock and data recovery circuit.

The memory control device 102 includes clock and data recovery (CDR) circuits 116 and transmitter circuits 118 coupled to one end of each of the serial interfaces 106. Similarly, the memory 104 includes clock and data recovery (CDR) circuits 114 and the transmitter circuits 112 at the other end of each of the serial interfaces 106. It should be understood that multiple CDR and transmitter circuits may be embedded within the memory 104 to accommodate all of the serial interfaces 106. The CDR circuits 114 within the memory 104 are coupled to a memory array 130 via data word connections 120 and via clock connections 122. The data word connections 120 provide a plurality of data bits concurrently (e.g. a 16 or 20 bit parallel data interface) to the memory array 130. This data is determined to be either a command to perform an operation on the memory device or data to be stored in the memory device. The output clocks 122 from the CDR circuits are downconverted in frequency compared to the frequency data communicated over the serial interface. For example, with a 20 bit data word, the clock 122 may be 20 times slower than the speed of the serial interface 106. Thus, the internal communication speed within the memory device 104 may be slower than the external data communication interface at an input port of the memory device 104. For example, the serial interface 106 may operate at 10 GHZ and the internal clocks 122 may be at 500 MHz. The transmitter circuits 112 within the memory 104 are coupled to a memory array 130 via data word connections 124 and via clock connections 126. The data word connections 124 provide a plurality of data bits concurrently (e.g., a 16 or 20 bit parallel data interface) from the memory array 130 to the transmitters 112. This data may be serialized and sent out on the serial interfaces 106. The input clocks 126 from the memory array 130 to the figure) to the transmitters 112 are multiplied up to the desired serial interface frequency and used to transmit the data across the serial interfaces 106.

In a particular illustrative embodiment, the memory 104 may further include error detection and correction logic, such as ECC logic and the memory may receive redundant data that is communicated over the serial interface 106. The redundant data may be used by the ECC logic to correct detected errors in the transmitted or stored data. In this arrangement, the memory system provides enhanced data recovery and increased performance. In another embodiment, the ECC logic may be selectively enabled or disabled. One method of providing the selection is via a specialized input pin signal to indicate an enable or disable state for the ECC logic. In this embodiment, the ECC logic would be coupled to the CDR and to the transmitter circuits via a multiplexer to provide for selective enablement or disablement of the ECC logic.

Figure 2:
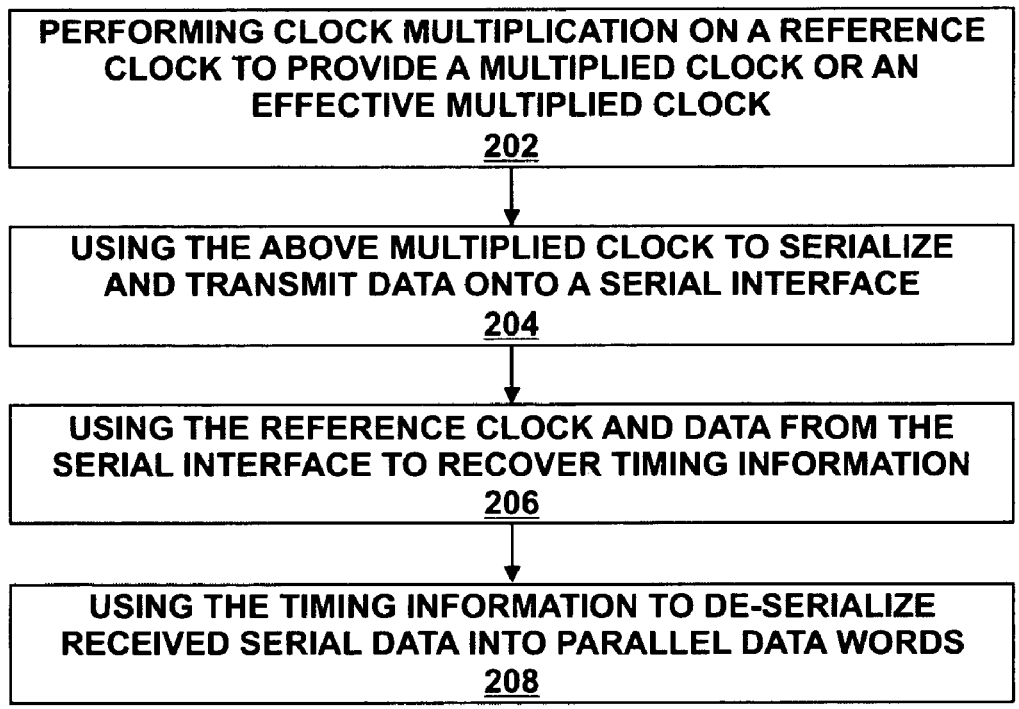
FIG. 2 is a flow chart that illustrates a method of transferring data within a memory system.

Referring to FIG. 2, a method of recovering data communicated over serial data interface of a memory device is illustrated. The method may be implemented within a data recovery circuit within a memory device or a memory control device. The method includes performing clock multiplication on a reference clock to provide a multiplied clock, as shown at 202. The method further includes using the multiplied clock to serialize and transmit data onto a serial interface, at 204. In addition, the method uses a reference clock to determine an initial frequency for use by a clock and data recovery module. The method further includes using the data from the serial interface to determine phase and final frequency of a recovered clock, at 206. In addition, the method includes using the recovered clock to de-serialize received serial data into parallel data words, as shown at 208.

Figure 3:
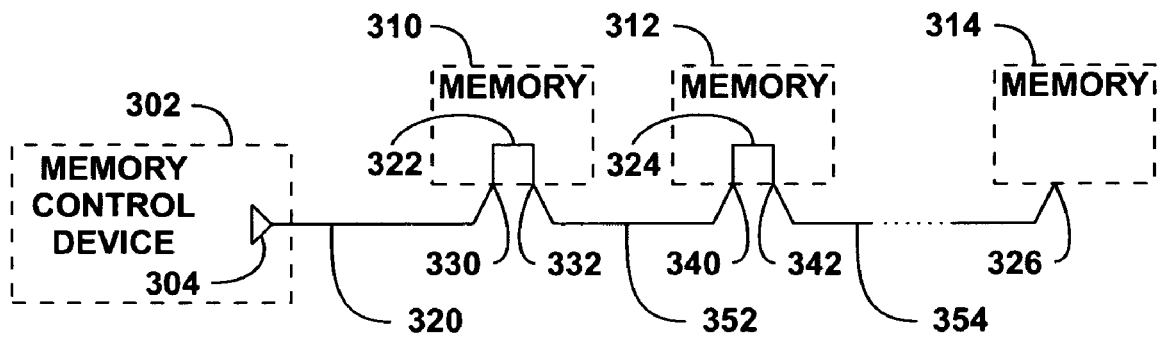
FIGS. 3–6 are block diagrams that illustrate various connections between a memory control device and multiple memory devices.

Referring to FIG. 3, a system is disclosed where a memory control device 302 is connected to a plurality of illustrative serially coupled memory devices 310, 312, 314. The memory control device 302 includes a driver circuit 304 that is coupled over a serial data connection 320 to an input pin 330 of the memory 310. The memory 310 further includes an output pin 332 and a direct circuit connection 322 that connects the input pin 330 to the output pin 332 without terminating within the memory 310. The second connected memory 312 similarly includes input pin 340, output pin 342 and internal connection 324. The last memory 314 in the series of memories terminates the signal at input pin 326. It should be understood that a single or multiple memory devices can be connected using serial data connections such as 320, 352, and 354. While clock signals are not shown, it should be understood that the memory devices and the memory control device may receive clock signals from a common reference clock in a similar manner as shown in FIG. 1. In addition, the serial data connection and the use of common reference clocks as described may be used with data communication components other than memory systems.

Figure 4:
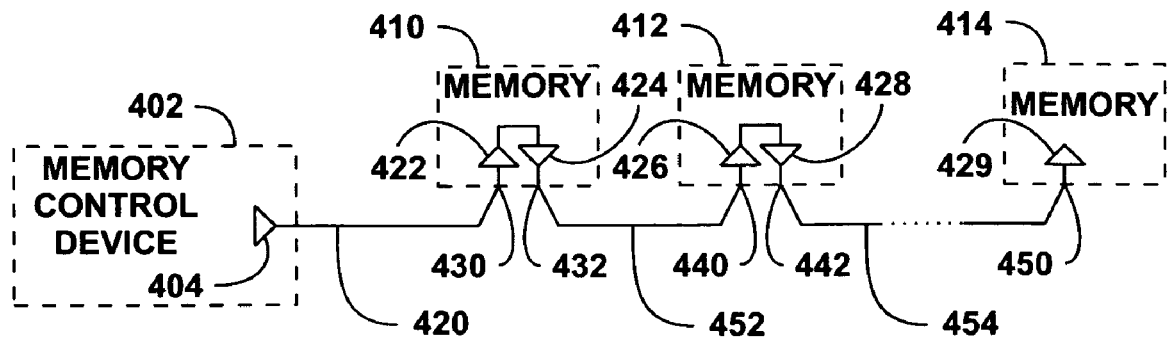

Referring to FIG. 4, a memory control device 404 is coupled in a serial fashion to a plurality of memory devices, such as illustrative memory devices 410, 412, and 414. Memory control device 402 includes a driver 404 coupled to a serial data connection 420. Each of the memory devices 410, 412, 414 includes an input driver. For example, memory device 410 includes input driver 422, memory device 412 includes driver 426, and memory device 414 includes driver 429. Serial data connection 420 is coupled to a first input pin 430 of the first memory 410. The data received at the input driver 422 is fed directly to the input of the output driver 424 and its output is fed to output pin 432. Data provided by output 432 is forwarded over the serial interface 452 to the input driver 426, via input pin 440. The output from input driver 426 is fed to output driver 428 that provides an output at output pin 442. The output from the output pin 442 is coupled to the serial data interface 454 and provided to subsequent serially connected memory devices and then finally passed to a terminating memory device, such as memory device 414 illustrated. At the terminating memory device 414, the data is received at input pin 450 and sent to input driver 429 and finally terminated within the memory device 414. While three illustrative memory devices are shown, it should be understood that a plurality of memory devices that may include more than three devices may be coupled in serial fashion. In addition, the serial data connection and the use of common reference clocks as described may be used with other data communication components other than memory systems.

Figure 5:
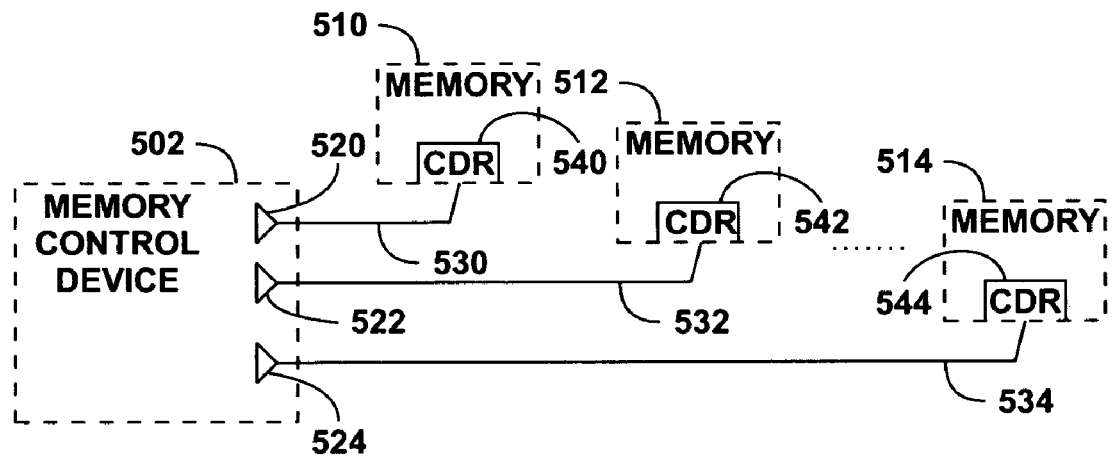

Referring to FIG. 5, the memory control device 502 includes a plurality of drivers 520, 522, 524. The interface includes a plurality of separate serial data connections to a plurality of different respective memory devices. For example, driver 520 is coupled over serial interface 530 to memory 510. Device driver 522 is coupled over serial interface 532 to memory 512, and device driver 524 is coupled over serial interface 534 to memory device 514. Each of the serial data links is coupled to a clock and data recovery circuit within each of the memory devices. As shown, memory 510 includes CDR 540, memory 512 includes CDR 542, and memory 514 includes CDR 544. Each of the CDR circuits is responsive to an external clock source, not shown, that is also coupled to the memory control device 502. While only three representative memory devices are shown, it should be understood that a plurality of memory devices, such as 8 or 16 memory devices may be coupled via a plurality of serial data interfaces to a memory control device 502. In a particular embodiment, the inputs of the drivers 520, 522, and 524 are logically equivalent. Also, it should be understood that the data communication method disclosed is applicable for communication devices other than the memory devices shown to provide chip-to-chip communication.

Figure 6:
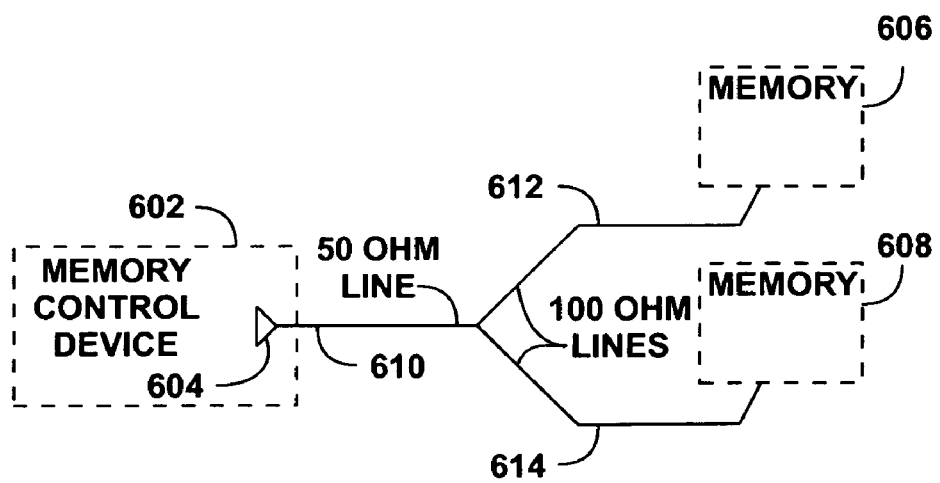

Referring to FIG. 6, an alternate embodiment of a system including a memory control device and multiple memory modules is shown. The memory control device 602 includes a memory driver 604 that provides a connection to a transmission line, such as the illustrated 50 ohm transmission line 610. The 50 ohm transmission line includes a junction of a first transmission path 612 provided to a first memory device 606 and a second transmission path 614 provided to a second memory device 608. The transmission paths 612 and 614 are each 100 ohm transmission conduits. While not specifically illustrated, it should be understood that the memory control device 602 and each of the memory devices 606 and 608 may include internal clock and data recovery (CDR) circuits similar to those discussed above with reference to FIG. 1. Also, it should be understood that the data communication method disclosed is applicable for communication devices other than the memory devices shown to provide chip-to-chip communication.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A unitary memory device comprising:
a memory array;
a first set of one or more serial interfaces to communicate memory operations, data, and address information to the unitary memory device;
a second set of one or more serial interfaces to communicate memory status and stored data from the unitary memory device;
one or more ports interacting with the memory array separately from each other port within the unitary memory device;
each serial interface associated with one of the memory ports; and
a reference clock interface, the reference clock interface configured to receive a signal from a reference clock source;
wherein at least one of the first set of one or more serial interfaces and at least one of the second set of one or more serial interfaces:
performs clock multiplication on a reference clock to provide a multiplied clock;
uses the multiplied clock to serialize and transmit data;
uses the reference clock and received data to recover timing information; and
uses the timing information to de-serialize received serial data.

2. A memory system comprising at least one unitary memory device as recited in claim 1 coupled to one or more memory control devices.

3. The memory device of claim 1, wherein each serial interface is coupled to at least a transmitter to send data onto the serial interface or a clock and data recovery module to receive data from the serial interface.

4. The memory device of claim 3, further comprising a plurality of clock and data recovery modules within the unitary memory device coupled to serial interfaces wherein each clock and data recovery module provides a recovered clock output and a plurality of parallel data line outputs.

5. The memory device of claim 4, wherein the memory array has a clock input coupled to either one of the recovered clock outputs from the clock and data recovery modules or a reference clock, and the memory array has a parallel data input coupled to the plurality of parallel data line outputs.

6. The memory device of clam 5, wherein one of the recovered clock outputs from one of the clock and data recovery modules is sent to all of the transmitters.

7. The memory device of claim 5, wherein a reference clock signal from the reference clock is sent to all of the transmitters.

8. The memory device of claim 5, wherein a reference clock signal from the reference clock is delayed an amount so that the phase of a delayed version of the reference clock signal is at a desired phase difference from one of the recovered clocks outputs from the clock and data recovery modules, and wherein the delayed version of the reference clock signal is sent to all of the transmitters.

9. The memory device of claim 1, further comprising error detection and correction logic.

10. The memory device of claim 9, further comprising a multiplexer coupled to the error detection and correction logic to provide for selective enablement of the error detection and correction logic.

11. The memory device of claim 1, further comprising:
a first pin to receive serial data from a memory control device; and
a second pin to retransmit the serial data to a second unitary memory device when a plurality of unitary memory devices are connected in series.

12. The memory device of claim 11, further comprising an internal communication path to communicate the serial data from the first pin to the second pin.

13. A memory system comprising:
a memory control device including a plurality of driver circuits including a first driver circuit and a second driver circuit, inputs of the driver circuits being logically equivalent;
a first memory device having a first serial interface coupled to an end of a first serial line that is coupled to the first driver circuit at the other end; and
a second memory device having a second serial interface coupled to an end of a second serial data line that is coupled to the second driver circuit at the other end;
wherein the first memory device includes a clock and data recovery circuit responsive to the first serial interface and is responsive to a reference clock signal from a reference clock source that is couple to the memory control device.

14. The memory system of claim 13, wherein at least one of the first and second memory devices includes:
a memory array;
a first set of one or more serial interfaces to communicate memory operations, data, and address information to the memory device; and
a second set of one or more serial interfaces to communicate memory status and stored data from the memory device;
wherein at least one of the first set of one or more serial interfaces and at least one of the second set of one or more serial interfaces;
performs clock multiplication on a reference clock to provide a multiplied clock;
uses the multiplied clock to serialize and transmit data;
uses the reference clock and received data to recover timing information; and
uses the timing information to de-serialize received serial data into parallel data words.

15. The memory system of claim 13, wherein at least one of the first and second memory devices includes:
a memory array;
a first set of one or more serial faces to communicate memory operations, data, and address information to the memory device,
a second set of one or more serial interfaces to communicate memory status and stored data from the memory device;
one or more ports interacting with the memory array separately from each other port within the memory device;
each serial interface associated with one of memory ports; and
a reference clock interface, the reference clock interface configured to receive a signal from a reference clock source.

16. The memory system of claim 15, wherein at least one of the first and second memory devices is a unitary memory device wherein the memory array, the first set of one or more serial interfaces, and the second set of one or more serial interfaces are embedded therein.

17. A memory system comprising:
a memory control device having an output driver circuit;
a transmission line having a first impedance coupled to the output driver circuit;
a first memory device coupled to a second transmission line having a second impedance; and
a second memory device coupled to a third transmission line having the second impedance;
wherein the first transmission line is connected to the second transmission line and to the third transmission line at a junction point.

18. The memory system of claim 17, wherein at least one of the first and second memory devices includes:
a memory array;
a first set of one or more serial interfaces to communicate memory operations, data, and address information to the memory device; and
a second set of one or more serial interfaces to communicate memory status and stored data from the memory device;
wherein at least one of the first set of one or more serial interfaces and at least one of the second set of one or more serial interfaces;
performs clock multiplication on a reference clock to provide a multiplied clock;
uses the multiplied clock to serialize and transmit data;
uses the reference clock and received data to recover timing information; and
uses the timing information to de-serialize received serial data into parallel data words.

19. The memory system of claim 17, wherein at least one of the first and second memory devices includes:
a memory array;

a first set of one or more serial interfaces to communicate memory operations, data, and address information to the memory device;

a second set of one or more serial interfaces to communicate memory status and stored data from the memory device;

one or more ports interacting with the memory array separately from each other port within the memory device;

each serial interface associated with one of the memory ports; and a reference clock interface, the reference clock interface configured to receive a signal from a reference clock source.

20. The memory system of claim 19, wherein at least one of the first and second memory devices is a unitary memory device wherein the memory array, the first set of one or more serial interfaces, and the second set of one or more serial interfaces are embedded in the unitary memory device.

* * * * *